US010809313B2

(12) United States Patent
Stahl-Offergeld et al.

(10) Patent No.: US 10,809,313 B2
(45) Date of Patent: Oct. 20, 2020

(54) METHOD FOR OFFSET COMPENSATION OF A SENSOR SIGNAL OF A HALL SENSOR AND SENSOR ARRANGEMENT

(71) Applicant: Fraunhofer-Gesellschaft zur Foerderung der angewandten Forschung e.V., Munich (DE)

(72) Inventors: Markus Stahl-Offergeld, Erlangen (DE); Markus Sand, Taennesberg (DE); Hans-Peter Hohe, Heiligenstadt (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 307 days.

(21) Appl. No.: 15/843,374

(22) Filed: Dec. 15, 2017

(65) Prior Publication Data

US 2018/0172779 A1    Jun. 21, 2018

(30) Foreign Application Priority Data

Dec. 16, 2016   (DE) .......................... 10 2016 225 305

(51) Int. Cl.
*G01R 33/07*  (2006.01)
*G01R 33/00*  (2006.01)

(52) U.S. Cl.
CPC ..... *G01R 33/0017* (2013.01); *G01R 33/0029* (2013.01); *G01R 33/0064* (2013.01); *G01R 33/07* (2013.01); *G01R 33/075* (2013.01)

(58) Field of Classification Search
CPC ............ G01R 33/0017; G01R 33/0029; G01R 33/0064; G01R 33/07; G01R 33/075
See application file for complete search history.

(56) References Cited

U.S. PATENT DOCUMENTS 5,062,062 A   10/1991 Nishibe et al.
5,757,181 A    5/1998 Wolf et al.
(Continued)

FOREIGN PATENT DOCUMENTS

CN   101802555 A   8/2010
CN   102132167 A   7/2011
(Continued)

OTHER PUBLICATIONS

Stahl-Offergeld et al., Offset Tracing in Hall Sensors by Integrated Temperature Coefficient Determination, 2009, Sensor+Test Conference 2009—Sensor 2009 Proceedings II, pp. 59-64 (Year: 2009).*
(Continued)

*Primary Examiner* — Toan M Le
(74) *Attorney, Agent, or Firm* — Perkins Coie LLP; Michael A. Glenn

(57) ABSTRACT

A central idea of techniques herein is that by means of modulation or variation of the supply signal of a Hall sensor, the useful signal portion in the resulting sensor output signal can be separated from the offset portion during operation of the Hall sensor, with no previous calibration or previous serial tests. That course of the sensor output signal resulting from the modulation or variation of the supply signal can then be evaluated or decomposed relative to the components which can be attributed to the offset portion and the useful signal portion. Thus, the offset portion in the sensor output signal can be determined with no (or a negligibly small) external magnetic field applied or with an external magnetic field applied, in case the external magnetic field is constant within a tolerance range while determining the offset portion.

31 Claims, 7 Drawing Sheets sensor arrangement 300

(56) References Cited

U.S. PATENT DOCUMENTS

| | | | |
|---|---|---|---|
| 6,097,183 | A | 8/2000 | Goetz et al. |
| 6,396,259 | B1 | 5/2002 | Washeleski et al. |
| 6,400,131 | B1 | 6/2002 | Turner |
| 8,203,329 | B2 | 6/2012 | Hohe et al. |
| 9,551,765 | B2 | 1/2017 | Röhrer et al. |
| 2005/0127899 | A1 | 6/2005 | Kakuta et al. |
| 2010/0217556 | A1 | 8/2010 | Hohe et al. |
| 2012/0086442 | A1 | 4/2012 | Haas et al. |
| 2014/0225597 | A1 | 8/2014 | Romero et al. |
| 2014/0266176 | A1 | 9/2014 | Fernandez et al. |
| 2015/0338473 | A1 | 11/2015 | Diaconu |

FOREIGN PATENT DOCUMENTS

| | | |
|---|---|---|
| DE | 69903277.6 T2 | 11/2002 |
| DE | 69827191.2 T2 | 12/2004 |
| DE | 03712808 T1 | 8/2005 |
| DE | 102007044471 A1 | 4/2009 |
| DE | 102011102483 A1 | 11/2012 |
| EP | 1498697 A1 | 1/2005 |

OTHER PUBLICATIONS

Kaufmann, Timo et al., "Piezoresistive Response of Vertical Hall Devices", IEEE Sensors Journal, IEEE Service Center, New York, vol. 11, issue 11, XP011363316, Nov. 2011, pp. 2628-2635.

\* cited by examiner

100

```
┌─────────────────────────────────────────────────────────────────────────┐
│ Performing a first offset compensation of the sensor signal S_0 for    │
│ providing a pre-compensated sensor signal S, wherein a portion of the  │──110
│ offset, linear relative to a supply signal S_DD, in the sensor signal  │
│ is eliminated or at least reduced in the first offset compensation     │
└─────────────────────────────────────────────────────────────────────────┘
                                    ↓
┌─────────────────────────────────────────────────────────────────────────┐
│ Establishing a plurality of N, with N ≥ 3, sensor signal values S_N in │
│ different offset measuring processes and with different supply signal  │
│ values S_DDN within a time interval Δt1, wherein the offset measuring  │──120
│ processes are executed in a temporal succession such that the measuring│
│ magnetic field acting on the Hall sensor is constant within a tolerance│
│ range during the time interval Δt1                                     │
└─────────────────────────────────────────────────────────────────────────┘
                                    ↓
┌─────────────────────────────────────────────────────────────────────────┐
│ Determining a fitting function F(S_DD) for the pre-compensated sensor  │
│ signal versus the supply signal S_DD based on the established N sensor │
│ signal values S_N, with                                                │
│   F(S_DD) = constant portion + linear portion + non-linear portion     │
│ wherein the non-linear portion of the fitting function is based on a   │
│ residual offset portion R in the pre-compensated sensor signal S, and  │
│ (1)  wherein the linear portion of the fitting function is based on    │──130
│      the constantly applying measuring magnetic field when the         │
│      pre-compensated sensor signal is proportional to a detected Hall  │
│      voltage of the Hall sensors; and                                  │
│ (2)  wherein the constant portion of the fitting function is based on  │
│      the constantly applying measuring magnetic field when the         │
│      pre-compensated sensor signal is proportional to the measuring    │
│      magnetic field acting which is established based on the detected  │
│      Hall voltage and the sensitivity of the Hall sensor;              │
└─────────────────────────────────────────────────────────────────────────┘
                                    ↓
┌─────────────────────────────────────────────────────────────────────────┐
│ Calculating an offset-reduced sensor signal value S_0 based on the     │──140
│ portion of the established fitting function which is based on the      │
│ constantly applying measuring magnetic field                           │
└─────────────────────────────────────────────────────────────────────────┘
                                    ↓
┌─────────────────────────────────────────────────────────────────────────┐
│ Detecting a sensor signal value S_N at a supply signal value S_DDN     │──150
└─────────────────────────────────────────────────────────────────────────┘
                                    ↓
┌─────────────────────────────────────────────────────────────────────────┐
│ Establishing the residual offset portion R of the pre-compensated      │
│ sensor signal S at the supply signal value S_DDN as the difference     │──160
│ between the sensor signal value S_N and the offset-reduced sensor      │
│ signal value S_0                                                       │
└─────────────────────────────────────────────────────────────────────────┘
                                    ↓
┌─────────────────────────────────────────────────────────────────────────┐
│ Performing an offset compensation of the sensor signal S based on the  │──170
│ established offset portion R at the supply signal value S_DDN          │
└─────────────────────────────────────────────────────────────────────────┘
```

Establishing a first sensor signal value S1 of the sensor signal S in a first offset measuring process based on a first supply signal value $S_{DD1}$ and a second sensor signal value S2 of the sensor signal in a second offset measuring process based on a second supply signal value $S_{DD2}$, wherein the first supply signal value $S_{DD1}$ is selected such that a residual offset portion R1 in the first sensor signal value S1 is less than 50% of the first sensor signal value S1, and wherein the first and second offset measuring processes are executed in a temporal succession such that the measuring magnetic field acting on the Hall sensor is constant within a tolerance range in the first and second offset measuring processes, and ~210

---

Establishing an offset portion R2 in the sensor signal S for the second supply signal value $S_{DD2}$ as the difference between the second sensor signal value $S_{DD2}$ and the first sensor signal value $S_{DD1}$ ~220

---

Performing an offset compensation of the sensor signal S based on the established offset portion R at the second supply signal value $S_{DD2}$ ~230

Fig. 2

METHOD FOR OFFSET COMPENSATION OF A SENSOR SIGNAL OF A HALL SENSOR AND SENSOR ARRANGEMENT

CROSS-REFERENCE TO RELATED APPLICATION

This application claims priority from German Application No. 10 2016 225 305.0, which was filed on Dec. 16, 2016, and is incorporated herein by reference in its entirety.

BACKGROUND OF THE INVENTION

Embodiments relate to a device and a method for offset compensation of a sensor signal of a Hall sensor, and to a sensor arrangement comprising a Hall sensor and processing means for performing the method. In particular, embodiments relate to a concept for offset compensation of a sensor output signal of a Hall sensor by means of modulation or variation of the supply signal, wherein, by modulating the supply voltage of the Hall sensor, the offset portion in the sensor output signal may also be determined using an external magnetic field applied, for example, in case the external magnetic field is constant within a tolerance range while determining the offset portion.

When an electric current flows through a Hall sensor and when a magnetic field is applied with a magnetic field component perpendicular to the current, the Hall sensor provides an output signal in the form of an output voltage (Hall voltage) which is proportional to the product of magnetic flux density and electric current intensity. Hall sensors or Hall effect elements generally comprise a high, strongly temperature-dependent offset portion in the sensor signal output.

The offset portion can be reduced using different, even combinable, procedures, like the spinning-current principle (SC method), orthogonal pair formation or forced symmetry.

In the so-called "spinning-current principle", for suppressing offset portions (offset voltage) in the sensor output signal resulting by geometry errors, piezo-resistive effects, inhomogeneous temperatures etc., Hall sensors having several terminals are set up to be symmetrical, like rotationally symmetrical in lateral Hall sensors. The detection contacts (Hall contacts) here are realized to be identical in shape, like supply contacts (current contacts). Two of these terminals serve as supply contacts, whereas two serve as Hall signal detection contacts. The function of the terminals is alternated in turns (successively in successive phases, in different current directions). By means of correspondingly evaluating the measuring results, the resulting offset portion in the Hall sensor output signal can be reduced considerably. Thus, it is possible to realize the spinning-current operation both in space and in time. "In space" means that several Hall sensors are realized in close spatial neighborhood and operated at the same time using different current directions. "In time" means that a Hall sensor is operated in different current directions at successive times. The final measuring value here exemplarily is the mean value of the individual measuring values of the different operating current directions in the different spinning-current operating phases. In addition, the procedures of both a temporal and a spatial realization of the spinning-current operation may be combined.

Vertical Hall sensors may also be operated using the spinning-current principle, even with no rotationally symmetrical implementation of these Hall sensors. A resulting rotational symmetry may exemplarily be generated by a suitable geometry of an individual Hall sensor, or several vertical Hall sensors (Hall effect sensor elements) may be forced to be symmetrical.

Another way of reducing the offset portion in the sensor output signal of lateral Hall sensors is "orthogonal pair formation". Here, several lateral Hall sensors, like multiples of two, are connected in parallel, however, similarly to the spinning-current principle, using a different current direction. The orthogonal pair formation thus corresponds to the "spatial" spinning-current operation, described above, of correspondingly interconnected lateral Hall sensors.

In vertical Hall sensors, a so-called "forced symmetry" can be applied for offset compensation. Due to the space charge zone and the geometry of the elements in the different spinning-current phases, vertical Hall sensors comprise different internal resistances which partly result in large individual-phase offsets, so that vertical Hall sensors may be operated using the spinning-current principle to a limited extent only. In order to implement the spinning-current principle in vertical Hall sensors, the so-called "forces symmetry" may, for example, be performed, wherein vertical Hall sensors which are each shifted by one contact, are connected in parallel although the elements are not symmetrical from an electric point of view. Thus, compensating currents exist between the Hall sensors so that, when looking at it from outside, the vertical Hall sensor arrangement consisting of several Hall sensors is rotationally symmetrical and consequently can be easily operated using the spinning-current principle.

Although the offset portion can be reduced using the spinning-current principle, the orthogonal pair formation or forced symmetry, frequently a temperature-dependent residual offset portion will remain in the sensor output signal. For many applications of Hall sensors, this residual offset portion has to be reduced further, which is why these Hall sensors have to be measured and calibrated individually in a serial test in the operating temperature range. This calibrating process generally proves to be very (time-) consuming since the temperature-dependent offset portion of the Hall sensors to be compensated has to be measured at different temperatures in a serial test and then be stored in the Hall sensor for the offset correction. This offset compensation is highly time-consuming and thus causes relatively high manufacturing costs for the corresponding Hall sensors.

SUMMARY

According to an embodiment, a method for offset compensation of a sensor signal $S_0$ of a Hall sensor may have the steps of: performing a first offset compensation of the sensor signal $S_0$ for providing a pre-compensated sensor signal $S$, wherein a portion of the offset, linear relative to a supply signal $S_{DD}$, in the sensor signal is at least reduced in the first offset compensation, establishing a plurality of N, with N≥3, sensor signal values $S_N$ in different offset measuring processes and with different supply signal values $S_{DDN}$ within a time interval $\Delta t1$, wherein the offset measuring processes are executed in a temporal succession such that the measuring magnetic field acting on the Hall sensor is constant within a tolerance range during the time interval $\Delta t1$, determining a fitting function $F(S_{DD})$ for the pre-compensated sensor signal versus the supply signal $S_{DD}$ based on the established N sensor signal values $S_N$, with $F(S_{DD})$=constant portion+linear portion+non-linear portion wherein the non-linear portion of the fitting function is based on a residual offset portion R in the pre-compensated sensor signal S, and (1) wherein the linear portion of the fitting function is based on the measuring magnetic field when the pre-compensated sensor signal is proportional to a detected Hall voltage of the Hall sensors; and (2) wherein the constant portion of the fitting function is based on the measuring magnetic field when the pre-compensated sensor signal is proportional to the measuring magnetic field acting which is established based on the detected Hall voltage and the sensitivity of the Hall sensor;

calculating an offset-reduced sensor signal value $S_0$ based on the portion of the established fitting function which is based on the measuring magnetic field; detecting a sensor signal value $S_N$ at a supply signal value $S_{DDN}$; establishing the residual offset portion R of the pre-compensated sensor signal S at the supply signal value $S_{DDN}$ as the difference between the sensor signal value $S_N$ and the offset-reduced sensor signal value $S_0$; and performing an offset compensation of the sensor signal S based on the established offset portion R at the supply signal value $S_{DDN}$.

According to another embodiment, a method for offset compensation of a sensor signal S of a Hall sensor may have the steps of: establishing a first sensor signal value S1 of the sensor signal S in a first offset measuring process based on a first supply signal value $S_{DD1}$ and a second sensor signal value S2 of the sensor signal in a second offset measuring process based on a second supply signal value $S_{DD2}$, wherein the first supply signal value $S_{DD1}$ is selected such that a residual offset portion R1 in the first sensor signal value S1 is less than 50% of the first sensor signal value S1, and wherein the first and second offset measuring processes are executed in a temporal succession such that the measuring magnetic field acting on the Hall sensor is constant within a tolerance range in the first and second offset measuring processes; establishing an offset portion R2 in the sensor signal S for the second supply signal value $S_{DD2}$ as the difference between the second sensor signal value $S_{DD2}$ and the first sensor signal value $S_{DD1}$; and performing an offset compensation of the sensor signal S based on the established offset portion R at the second supply signal value $S_{DD2}$.

According to another embodiment, a sensor arrangement may have: a Hall sensor for detecting a component of a measuring magnetic field and for outputting a sensor signal S based on the detected component of the measuring magnetic field, and processing means configured to execute the method for offset compensation of a Hall sensor of one of the above inventive methods.

The central idea of the present invention is that, by means of modulation or variation of the supply signal of a Hall sensor, the useful signal portion in the resulting sensor output signal can be separated from the offset portion during operation of the Hall sensor, with no previous calibration or previous serial tests. That course of the sensor output signal resulting from the modulation or variation of the supply signal can then be evaluated or decomposed relative to the components which can be attributed to the offset portion and the useful signal portion. Thus, the offset portion in the sensor output signal can be determined with no (or a negligibly small) external magnetic field applied or with an external magnetic field applied, in case the external magnetic field is constant within a tolerance range while determining the offset portion.

Since, in reality, the external magnetic field frequently cannot be assumed to be exactly constant or the concept present still provides sufficient compensation results when the external magnetic field (i.e. the magnetic field intensity or flux density) remains within a predetermined region or there is no or only a negligibly small external magnetic field applied, a so-called "tolerance range" is introduced or provided for the "respective stability" of the external magnetic field. The tolerance range thus indicates that region within which the external magnetic field is allowed to change while determining the offset portion or residual offset portion. The tolerance range may, for example, indicate that the external magnetic field changes by less than 50%, 30%, 20%, 10%, 5%, 1% or 0.1% while determining the offset portion or residual offset portion, or that there is no or only a negligibly small external magnetic field. The smaller the tolerance range which can be assumed and kept, the more precisely can the offset compensation be performed.

In case a potential or typical change rate of the external magnetic field is known, a time interval $\Delta t1$ for the compensation process can be selected such that the offset measuring processes are performed to be (shortly) successive in time such that, during the time interval $\Delta t1$, the measuring magnetic field acting on the Hall sensor is constant within the (predetermined) tolerance range or there is no or only a negligibly small external magnetic field.

The offset portion in the output signal of a Hall sensor is highly dependent on the supply signal, for example the supply voltage or the supply current, wherein, for a low supply signal value, the offset portion in the sensor output signal can be assumed to be negligible (i.e. ≤20%, 10%, 5%, 1% or 0.1% of the useful signal portion), whereas the offset portion in the sensor output signal increases "non-linearly" with increasing supply signal values. The sensitivity of a Hall sensor in contrast is directly proportional to the supply signal applied. Assuming that, while determining the offset portion in the sensor output signal, the measuring magnetic field acting on the Hall sensor is consistent within a tolerance range and that there is no "essential" change of the present temperature at the Hall sensor, for example, a separation between the useful signal portion and the offset portion in the sensor output signal can be obtained during operation by performing a "modulation" (i.e. setting different values) of the supply signal. The offset portion in the sensor output signal in this case can nearly be eliminated or at least be reduced strongly, since the "quasi-offset-free" measuring value for the sensor output signal can be determined at a very low supply signal value, whereas subsequently, in normal operation, the offset portion can be determined at a high supply signal, and be removed from the sensor output signal.

Thus, the high sensitivity of a Hall sensor at high supply signal values can be combined with the low offset portion in the sensor output signal at a low supply signal value, which means that the offset portion, with the high supply signal value, can be determined based on the known (high) sensitivity of the Hall sensor and the (quasi-offset-free) measuring value at the low supply signal value during operation of the Hall sensor.

In order to implement the inventive concept for offset compensation of a sensor output signal of a Hall sensor, different procedures using modulation or variation of the supply signal may be selected, for example.

In accordance with one embodiment, one potential procedure for implementing the inventive concept is obtaining, by means of a "modulation or variation" of the supply signal and a corresponding measurement of the sensor output signal at different (modulated) supply signal values, a typical function for the output signal course versus the supply signal course, wherein this typical function reproduces the course of the non-linear offset portion versus the supply signal, for example. When supplementing this "typical function" by a linear portion which corresponds to the external magnetic field B to be measured, this typical function can be used to reproduce both the offset portion and the useful signal portion in the sensor output signal as a function relating to the supply signal. The supply signal, like the sensor voltage, is modulated or varied here, and the respective sensor signal value (sensor output signal value) is determined for a plurality of measuring points, i.e. for at least three or even more measuring points. The typical function will then be "fitted" (established) based on these "measuring points", for example by means of a measuring kit. This typical function is referred to as a "fitting function", for example.

Thus, the fitting function $F(S_{DD})$ for the (for example pre-compensated) sensor output signal versus the supply signal $S_{DD}$, based on the N sensor signal values $S_N$ found, comprises a combination of a constant portion, a linear portion and a non-linear portion, wherein the non-linear portion of the fitting function is based on a residual offset portion in the (pre-compensated) sensor signal.

When the sensor signal is proportional to a Hall voltage detected of the Hall sensor, the "linear" portion of the fitting function is based on the (constantly applying) measuring magnetic field. In correspondence with the inventive concept, the Hall voltage measured can exemplarily be used directly (as sensor output signal), wherein the linear portion of the fitting function (fitted function) provides the nearly offset-free useful signal portion (measuring value), due to the proportional relation of supply signal and sensitivity of the Hall sensor.

When, however, the pre-compensated sensor output signal is proportional to the external magnetic field calculated which is determined based on the Hall voltage detected and the sensitivity of the Hall sensor, the "constant" portion of the fitting function is based on the (constantly applying) measuring magnetic field. The procedure described may also be applied when the sensor output signal, i.e. the Hall voltage measured, has already been converted to the value of the measuring magnetic field applied by means of the sensitivity of the Hall sensor. In this case, a different typical function is to be used, wherein the "constant portion" of the fitted function is to be used as the resulting (nearly offset-free) measuring signal, since, in the mT range in Hall sensors, the output signal is basically constant relative to the supply signal.

In dependence on the type or rendering of the (pre-compensated) sensor output signal which is exemplarily proportional to the Hall voltage detected of the Hall sensor or (alternatively) proportional to the measuring magnetic field acting, the nearly offset-free measuring value, i.e. the useful signal portion of the sensor output signal, can thus be obtained. When operating the Hall sensor using the "full" (high) supply signal, the offset portion can be determined at such a high supply signal. The further measuring values, i.e. the sensor output signal, can be corrected using this offset portion determined.

Determining a fitting function is connected to a certain calculating performance used. When looking at a potential typical function (fitting function), like $f(x)=a+bx+e^{dx}$, or $f(x)=a+bx+dx^n$ ... (Taylor Series), with $x=S_{DD}$, for small supply signals, the non-linear term, i.e. the term $e^{dx}$, or the higher-order terms with a Taylor Series, will be approximately zero. Starting from the Hall voltage measured of the Hall sensor as a sensor output signal, the constant portion of the typical function generally is very small, since the linear portion of the offset has exemplarily already been pre-compensated or reduced by applying a spinning-current principle.

Thus, the high sensitivity at the high supply signal can be combined with the low offset portion at the low supply signal in order to determine the offset-compensated useful signal portion of the sensor output signal at the high supply signal.

Determining a fitting function entails a certain calculating performance used which can be reduced considerably with still very good compensation results by using the further procedure described below.

In accordance with an embodiment for another potential procedure for implementing the inventive concept, using a (exemplarily single) measurement at a low supply signal value, when knowing the sensitivity of the Hall sensor, the (currently applied) external measuring magnetic field can be measured or detected at a considerably reduced offset portion. When the (low) supply signal value has been selected to be sufficiently low, the residual offset portion in the sensor output signal can be considered to be negligibly low.

In a practical application for this procedure, this means that the external measuring magnetic field at a low supply signal value is measured at the Hall sensor. The low supply signal value is selected to be smaller than or equaling ($\leq$) 50%, 30%, 20% or 10% relative to the higher supply signal value, for example. Here, a measuring value (sensor output signal or sensor output signal value) having a very low (negligible) offset portion which may exemplarily be assumed to be "0" is determined. Subsequently, the supply signal value, like the supply voltage or the supply current, is increased again, whereupon another measurement of the sensor output signal is performed at the higher supply signal value. Then, the measuring signal or measuring value contains the actual magnetic field (as a useful signal portion) and the relatively large offset portion.

Assuming that meanwhile the external magnetic field has essentially remained constant (i.e. within a predetermined tolerance range) between the two measuring processes, the remaining offset portion can be determined or established at the high supply signal value. The further measuring values or sensor signal values, at this high supply signal value, can then be corrected by the offset portion, i.e. the offset portion can be subtracted from the respective measuring value, in order to obtain the remaining useful signal portion in the sensor output signal.

Thus, the high sensitivity of a Hall sensor at a high supply signal value can be combined with the low offset portion at a low supply signal value, in order to obtain the offset-reduced or offset-compensated sensor output signal at the high supply signal value.

It is also possible to measure the external measuring magnetic field applied with a considerably reduced offset in the sensor output signal using a (single) measurement at a low supply signal. With the low supply signal, only the constant portion and the exponential portion will remain as a residual offset portion, which are negligibly small. In a practical application, this means that the external measuring magnetic field is measured at a (sufficiently) low supply signal. The result is a measuring value (sensor output signal) having a very low offset portion which may be assumed to be zero. Subsequently, the supply signal is increased again and another measurement of the sensor output signal is performed. At that point, the measuring signal, i.e. the sensor output signal, at the high supply signal contains the actual measuring magnetic field and the relatively large offset portion. Assuming that the external measuring magnetic field applied has remained constant (within a tolerance range) during these measuring points in time, the offset portion at the high supply signal can be determined to be the difference between the measuring signal value (at the high supply signal) and the measuring signal value at the low supply signal. The further measuring values at the high supply signal may then be corrected by the offset portion determined.

This offset compensation of the output signal of a Hall sensor can be performed during operation of the Hall sensor with no previous calibration or previous serial test of this Hall sensor.

The present concept may thus be used, for example, with Hall sensors for compensating the temperature-dependent offset portion present in the sensor output signal, wherein principles for offset compensation applied already to the sensor signal, like the spinning-curling principle (SC principle), orthogonal pair formation and forced symmetry, where generally a temperature-dependent residual offset portion will remain, can still be supported.

One characteristic of the present concept is that the offset portion of a sensor output signal of a Hall sensor can be determined at least approximately during operation, with no complicated serial test or calibration at partly different temperatures being used before for offset compensation.

With pre-compensation by means of one of the principles mentioned before, like spinning current, orthogonal pair formation and/or forced symmetry, already constant and linear offset portions in the Hall sensor output signal or the Hall voltage can be removed nearly completely. When plotting the Hall output signal (Hall voltage) measured versus the supply signal, i.e. the supply voltage or supply current of a Hall element, for example, the "linear portions" of this course can consequently be caused only by the magnetic signal, i.e. the external magnetic field applied. All the other portions, constant portions, non-linear portions, square portions and/or higher-order portions, can be separated from the output signal course and be interpreted to be the offset portion.

This means that an offset correction of the sensor output signal during operation with no previous calibration or previous serial test is possible from a calculating point of view. The inventive concept is thus based on the fact that the offset portion of a (for example pre-compensated) sensor output signal of a Hall sensor is strongly dependent on the supply voltage. The sensitivity of a Hall sensor in contrast is directly proportional to the supply voltage. Making use of such relations allows the present principle of separating the useful signal portion and the offset portion in the sensor output signal for an offset compensation during operation of a Hall sensor.

Using the present concept for offset compensation, it is not only possible to perform the offset portion during operation and with no previous calibration and no previous serial test of the Hall sensor, but it is also possible to recognize errors in the entire system or the entire circuit arrangement, since the offset portion of the Hall sensors during operation is still known and consequently conclusions as to system errors can be drawn. Up to now, this has not been possible since, up to know, differentiation between a sensor offset drift and an amplifier offset drift within the circuit arrangement has not been possible and, consequently, no conclusion could be drawn in this respect.

BRIEF DESCRIPTION OF THE DRAWINGS

Embodiments of the present invention will be detailed subsequently referring to the appended drawings. With regard to the Figures illustrated, it is pointed out that the functional blocks illustrated are to be understood to represent both elements or features of a sensor arrangement and corresponding method steps/process steps of the present concept for offset compensation. The Figures show:

FIG. 1 a flow chart of a method for offset compensation in accordance with an embodiment;

FIG. 2 a flow chart of a method for offset compensation in accordance with anther embodiment;

DETAILED DESCRIPTION OF THE INVENTION

Figure 3:
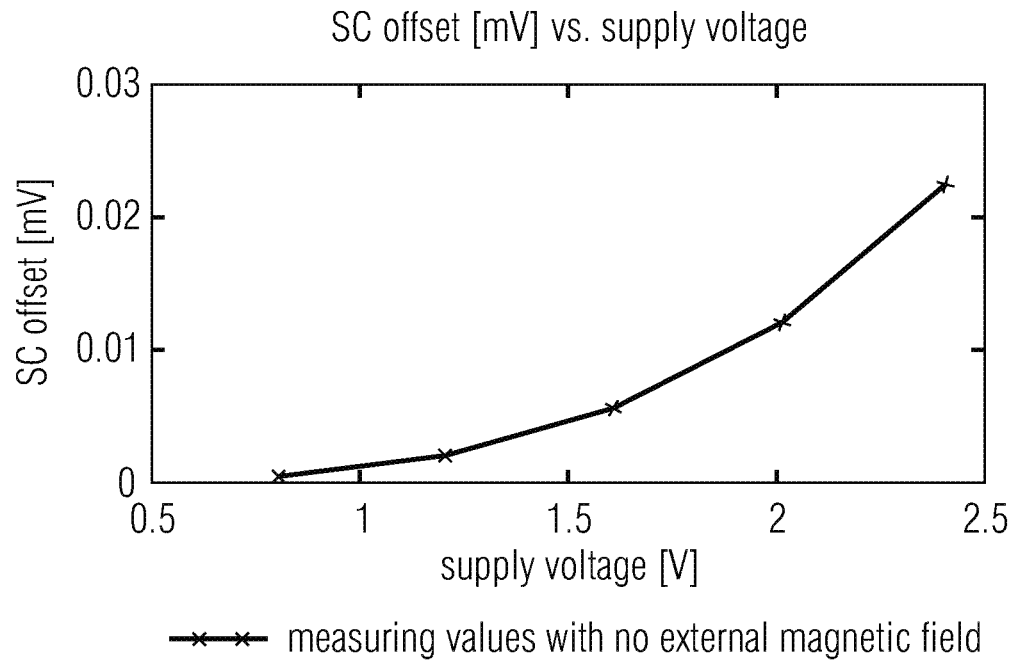
FIG. 3 a graphical illustration of a typical course or relationship of an offset portion of a (exemplarily spinning-current-compensated) Hall sensor output signal of a Hall sensor versus the supply signal.

Before embodiments of the present concept will be discussed below in greater detail referring to the Figures, it is pointed out that identical elements, objects, functional blocks and/or method steps or those of equal function or equal effect, in the different figures, are provided with same reference numerals so that the description, illustrated in the different embodiments, of these elements, objects, functional blocks and/or method steps is mutually exchangeable or mutually applicable.

FIGS. 1 and 2 shows flow charts of the inventive concept for offset compensation of a sensor output signal of a Hall sensor by means of modulation or variation of the supply signal, like of the supply voltage or supply current. A Hall sensor may exemplarily comprise a Hall effect sensor element or a plurality of (exemplarily interconnected) Hall effect sensor elements. The sensor signal may be a sensor output signal of an individual Hall effect sensor element or a combination of sensor output signals from a part of the plurality of Hall effect sensor elements or from all of the plurality of Hall effect sensor elements. Thus, the sensor signal may also be based on the sensor output signal of an individual Hall effect sensor element, or on a combination of the sensor output signals from a part of the plurality of Hall effect sensor elements, or from all of the plurality of Hall effect sensor elements.

In accordance with an embodiment, the present concept comprises a method 100 for offset compensation of a sensor signal $S_0$ of a Hall sensor, comprising the steps of:

performing 110 a first offset compensation of the sensor signal $S_0$ for providing a pre-compensated sensor signal S, wherein a portion of the offset, linear relative to a supply signal $S_{DD}$, in the sensor signal is eliminated or at least reduced in the first offset compensation, establishing 120 a plurality of N, with sensor signal values $S_N$ in different offset measuring processes and with different supply signal values $S_{DDN}$ within a time interval $\Delta t1$, wherein the offset measuring processes are executed in a temporal succession such that the measuring magnetic field acting on the Hall sensor is constant within a tolerance range during the time interval $\Delta t1$, determining 130 a fitting function $F(S_{DD})$ for the pre-compensated sensor signal versus the supply signal $S_{DD}$ based on the established N sensor signal values $S_N$, with $$F(S_{DD}) = \text{constant portion} + \text{linear portion} + \text{non-linear portion}$$

wherein the non-linear portion of the fitting function is based on a residual offset portion R in the pre-compensated sensor signal S, and (1) wherein the linear portion of the fitting function is based on the (constantly applying) measuring magnetic field when the pre-compensated sensor signal is proportional to a detected Hall voltage of the Hall sensors; and (2) wherein the constant portion of the fitting function is based on the (constantly applying) measuring magnetic field when the pre-compensated sensor signal is proportional to the measuring magnetic field acting which is established based on the detected Hall voltage and the sensitivity of the Hall sensor;

calculating 140 an offset-reduced sensor signal value $S_0$ based on the portion of the established fitting function which is based on the (constantly applying) measuring magnetic field;

detecting 150 a sensor signal value $S_N$ at a supply signal value $S_{DDN}$;

establishing 160 the residual offset portion R of the pre-compensated sensor signal S at the supply signal value $S_{DDN}$ as the difference between the sensor signal value $S_N$ and the offset-reduced sensor signal value $S_0$; and performing 170 an offset compensation of the sensor signal S based on the established offset portion R at the supply signal value $S_{DDN}$.

In accordance with an embodiment, the present concept comprises another method 200 for offset compensation of a sensor signal S of a Hall sensor, comprising the steps of:

establishing 210 a first sensor signal value S1 of the sensor signal S in a first offset measuring process based on a first supply signal value $S_{DD1}$ and a second sensor signal value S2 of the sensor signal in a second offset measuring process based on a second supply signal value $S_{DD2}$, wherein the first supply signal value $S_{DD1}$ is selected such that a residual offset portion R1 in the first sensor signal value S1 is less than 50% of the first sensor signal value S1, and wherein the first and second offset measuring processes are executed in a temporal succession such that the measuring magnetic field acting on the Hall sensor is constant within a tolerance range in the first and second offset measuring processes;

establishing 220 an offset portion R2 in the sensor signal S for the second supply signal value $S_{DD2}$ as the difference between the second sensor signal value $S_{DD2}$ and the first sensor signal value $S_{DD1}$; and performing 230 an offset compensation of the sensor signal S based on the established offset portion R at the second supply signal value $S_{DD2}$.

By means of a modulation or variation of the supply signal of a Hall sensor, in the resulting sensor output signal, the useful signal portion can be separated from the offset portion during operation of the Hall sensor. The resulting course of the sensor output signal can be evaluated relative to the components attributed to the offset portion and the useful signal portion.

The offset portion in the output signal of a Hall sensor is highly dependent on the supply signal, like the supply voltage or the supply current, wherein, for a low supply signal value, the offset portion in the sensor output signal can be assumed to be negligible, whereas the offset portion in the sensor output signal increases "non-linearly" with increasing supply signal values. The sensitivity of a Hall sensor in contrast is directly proportional to the supply signal applied. Assuming that, while establishing the offset portion in the sensor output signal, the measuring magnetic field acting on the Hall sensor is constant within a tolerance range, in accordance with the invention, the useful signal portion and the offset portion in the sensor output signal can be separated during operation by performing a "modulation" (i.e. setting different values) of the supply signal. The offset portion in the sensor output signal can nearly be eliminated or at least be reduced strongly, since the "quasi-offset-free" measuring value for the sensor output signal can be established at a very low supply signal value, wherein subsequently, during normal operation at a high supply signal value, the offset portion can be determined and eliminated from the sensor output signal. Thus, the high sensitivity of a Hall sensor at high supply signal values can be combined with the low offset portion in the sensor output signal at a low supply signal value, i.e. the offset portion at the high supply signal value can be determined during operation of the Hall sensor based on the known (high) sensitivity of the Hall sensor and on the (quasi-offset-free) measuring value at the low supply signal value.

The physical relationship relating to the mode of functioning and functionality of Hall sensors on which the present concept for compensating an offset portion in a sensor output signal of a Hall sensor by means of modulation or variation of the supply signal is based will be discussed below.

In this context, it is pointed out at first that the present concept may be applied to any types or structures of Hall effect sensor elements (Hall sensors), like lateral or vertical Hall elements. Based on a supply signal, such as, for example, a supply voltage or a supply current, a current flow through the Hall sensor is effected, wherein the Hall sensor provides an output signal, like an output voltage or Hall voltage, when an external magnetic field component which is perpendicular to the current flow is applied to the Hall sensor or penetrates the Hall sensor. This output voltage of the Hall sensor is proportional to the product of the magnetic flux density of the external magnetic field component applied and the current through the Hall sensor. The output signal is temperature-dependent and, apart from the useful signal portion which depends exclusively on the external magnetic field applied, additionally comprises a (frequently also temperature-dependent) so-called "offset portion".

The following concept for compensating an offset portion in the sensor output signal of a Hall sensor by means of modulation or variation of the supply signal here may exemplarily be applied directly to the sensor output signal, or also to a Hall sensor output signal of a Hall sensor which has already been subjected to a so-called "offset pre-compensation". In order to compensate the frequently great and, additionally, strongly temperature-dependent offset portion in the sensor output signal of a Hall sensor (Hall effect sensor element), the following, combinable principles are applied, among others, like the spinning-current principle (SC principle), the principle of orthogonal pair formation and/or forced symmetry principle, wherein, even after such a pre-compensation, a temperature-dependent residual offset portion will mostly remain in the sensor output signal. Even when using the pre-compensation principles described before exemplarily, a temperature-dependent residual offset portion will generally remain in the resulting (pre-compensated) sensor output signal.

The inventive concept for compensating an offset portion in a Hall sensor output signal by means of modulation or variation of the supply signal consequently may be applied also to pre-compensated Hall sensor output signals.

As is illustrated in the graphical illustration of FIG. 3 in a typical course of an offset portion (like an already "pre-compensated" Hall sensor output signal) of a Hall sensor versus the supply signal, like the supply voltage or supply current, the offset portion (like SC-Offset=Spinning-Current pre-compensated offset) of a Hall sensor exhibits a high (non-linear) dependence on the supply signal. In FIG. 3, the measuring values relating to the offset portion are exemplarily illustrated with no external magnetic field applied, versus the supply voltage of the Hall sensor. This typical relationship results in a qualitative manner both for a non-pre-compensated and also for a pre-compensated sensor output signal.

With no pre-compensation, a linear offset portion is superimposed on the non-linear offset portion, wherein the offset portion, at a low supply voltage, is still smaller than the offset portion at a respective higher supply voltage.

In the following description and in the figures, a supply voltage of a Hall sensor is provided as the supply signal, wherein the procedures are equally applicable to a situation where the Hall sensor is fed with a supply current as the supply signal. A supply current and a supply voltage may exemplarily be converted to each other by means of the (ohmic) resistance or internal resistance of the Hall sensor. This assumption is applicable to all the embodiments or methods and method steps of the concept illustrated here.

Figure 4:
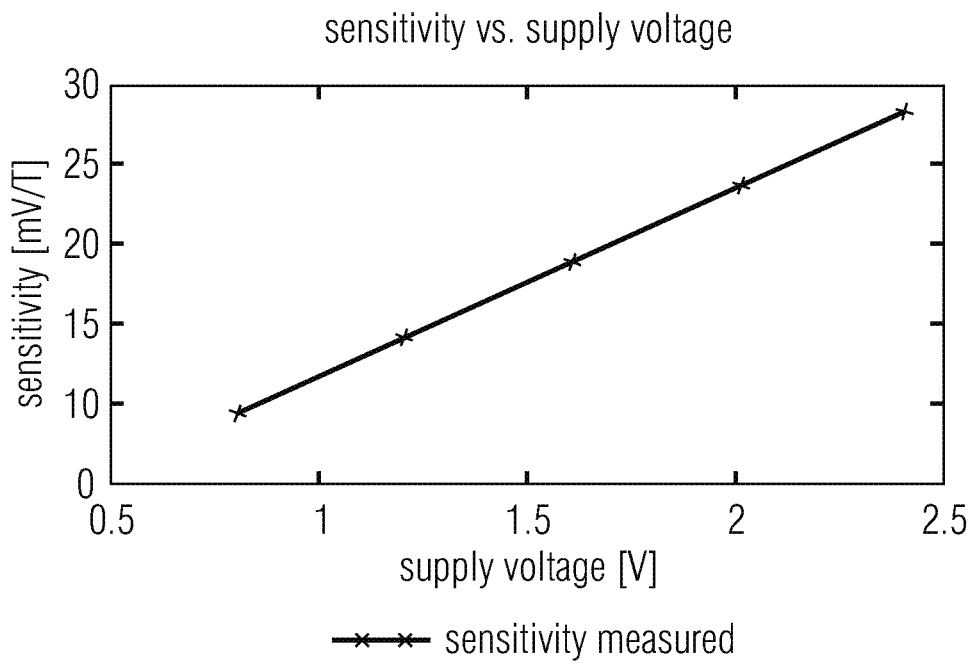
FIG. 4 a graphical illustration of a typical course of the sensitivity of a Hall sensor versus the supply signal.

FIG. 4 graphically illustrates the relationship between the (voltage-related) sensitivity [mV/T] of a Hall sensor versus the supply voltage [V] applied to the sensor element for a plurality of sensitivity values measured. As can be gathered from FIG. 4, the sensitivity of a Hall sensor (Hall effect sensor element) to the offset portion versus the supply voltage (cf. FIG. 3), comprises a direct proportionality to the supply voltage at the Hall sensor.

Based on the present concept, it is no longer required to select between the two following possibilities, i.e. (1) using a high supply voltage in order to obtain a high sensitivity with at the same time a comparatively high offset portion or (2) using a low supply voltage which results in a low sensitivity of the Hall sensor, but with a comparatively low offset portion. As the following explanation will show in particular, one advantage of the inventive concept is that, by means of modulating or varying the supply signal, i.e. the supply voltage or the supply current, the offset portion in the sensor output signal of the Hall sensor can be nearly eliminated or at least be reduced strongly. When, in accordance with the present concept, the "quasi"-offset-portion-free measuring value (sensor output signal value) is known, subsequently the respective offset portion can be determined during normal operation of the Hall sensor at a high supply voltage and the resulting useful signal portion (effective portion) of the Hall sensor output signal be established. This can be assumed as long as the measuring magnetic field acting on the Hall sensor has remained constant within a tolerance range while establishing the offset portion in the Hall sensor output signal.

Making reference to physical and/or technological basics of Hall sensors, as has been described before, the (voltage-related or current-related) sensitivity of a Hall effect sensor element (Hall sensor) is directly proportional to the supply voltage. Thus, the non-linear course of the offset portion in the Hall sensor output signal versus the supply signal is based on the fact that, with pre-compensation of the Hall sensor output signal for example, due to the spinning-current principle, linear offset causes can be reduced relatively strongly or eliminated already. What remains is that offset portions which have their (electronic) origin in the region of the space charge zone (in the depth region) of the Hall sensor.

In accordance with the present concept, it is possible for the sensor technology used, i.e. for the type of Hall sensor used having one or a plurality of Hall effect sensor elements, to determine a typical function or a functional relationship using which the non-linear offset portion in the Hall sensor output signal versus the supply signal can be reproduced.

When supplementing this function established (for the Hall voltage as the Hall sensor output signal) by a linear portion which corresponds to the "top" constant external magnetic field, this function can be used in order to reproduce the offset portion and the useful signal portion in the Hall sensor output signal.

When this function is related to a quantity derived already from the Hall voltage, like the quantity of the magnetic field applying calculated using the sensitivity of the Hall sensor, and when this function is supplemented by a "constant" portion, in this (alternative) case, it can be used to reproduce the offset portion and the useful signal portion in the Hall sensor output signal.

Subsequently, the case in which the function reproduces the Hall voltage (sensor voltage) will be discussed in general, wherein the explanations are applicable correspondingly when the function reproduces a quantity derived from the Hall voltage, like the magnetic field applying calculated from it using the sensitivity.

The supply voltage (sensor voltage) of the Hall sensor is then modulated or varied, i.e. the sensor signal takes a plurality of (at least two) different values, wherein subsequently the typical function is "fitted" in order to thus obtain the fitted function or fitting function.

In the present description, "fitting" is understood to be a so-called "adjusting calculation" in the form of a mathematical optimizing method in order to determine or estimate the parameters of a predetermined function (fitting function). Fitting or fit exemplarily means a functional adaptation, wherein potential measuring errors or uncertainties of the measuring points can also be taken into consideration. One potential method or procedure of a fit is the least mean square method, where a measuring uncertainty of a Gaussian distribution is assumed, for example. Different procedures and algorithms for determining the fitting function may also be employed of course as long as the course of the sensor output signal or a quantity derived therefrom can be reproduced by the fitting function in a sufficiently precise manner.

When exemplarily the fitting function reproduces the sensor output signal in the form of a Hall voltage, the nearly offset-free measuring value, i.e. the useful signal portion of the sensor output signal, is obtained by making use of the linear portion of the fitting function.

When, in contrast, the fitting function reproduces a derived quantity of the Hall voltage of the Hall sensor, like the quantity of the external magnetic field applying determined using the sensitivity of the Hall sensor, using the "constant" portion of the fitting function will result in a nearly offset-free measuring value, i.e. the useful signal portion of the Hall sensor output signal or the quantity derived therefrom.

When the Hall sensor is operated again at the high (full) supply voltage, the offset portion at the high supply voltage can be determined such that, using said offset portion determined, the further measuring values, i.e. Hall sensor output signal values, at the high supply voltage, which results in a high sensitivity of the Hall sensor, can be corrected.

In correspondence with the present procedure, i.e. the present concept, with a constant external magnetic field (within a tolerance range), the sensor voltage (i.e. the supply signal) is modulated and, subsequently, the typical function (fitting function) is fitted or determined.

Figure 5:
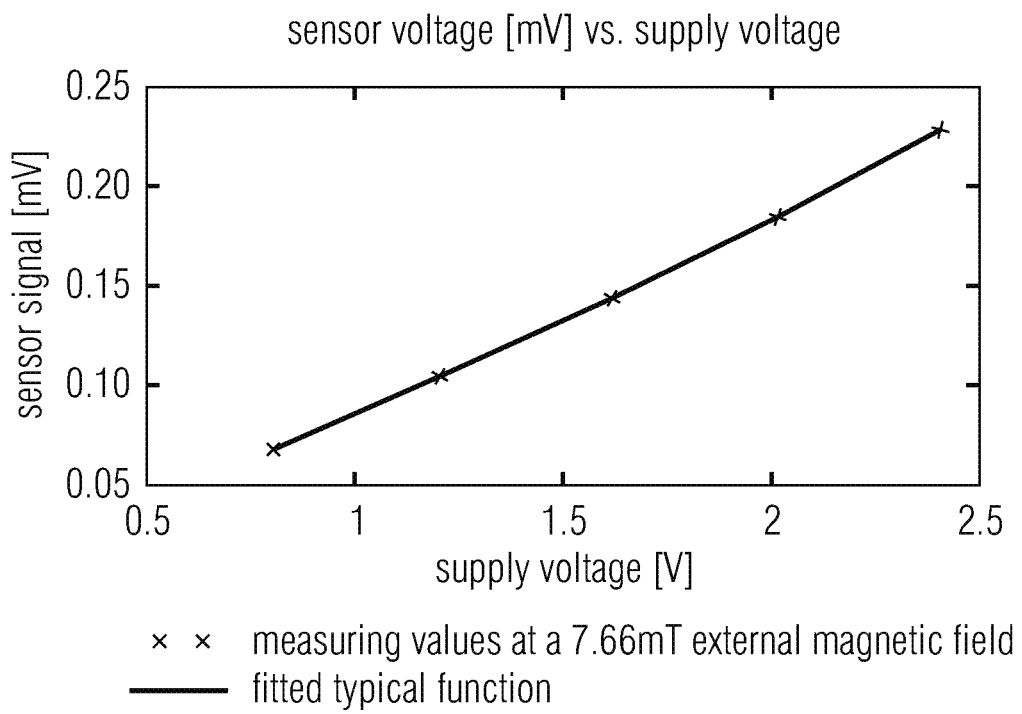
FIG. 5 a graphical illustration of typical measuring values of a sensor output signal and a typical course of a fitted function (fitting function) of a sensor output signal of a Hall sensor based on the measuring values versus the supply signal in accordance with an embodiment.

For illustration purposes, FIG. 5 shows an exemplary graphical illustration of a typical course of a sensor signal (like of a Hall voltage in the mV range) versus different supply voltage values in an exemplary supply voltage range. In the graphical illustration shown in FIG. 5, an external magnetic field with an exemplary intensity (magnetic flux density) of 7.66 mT is applied, wherein the sensor voltage (supply voltage) is modulated or varied from 0.6 V to 2.4 V. In FIG. 5, on the one hand, the (for example five) measuring values measured with a 7.66 mT external magnetic field are provided, and the obtained typical fitted function (fitting function) is shown as a continuous line. The (red) crosses consequently are the actual measuring values, whereas the (blue) curve represents the fitted function (fitting function). The three components of the exemplary fitting function, i.e. the linear portion, the exponential portion and the constant portion, are illustrated graphically in FIG. 6.

The fitting function $F(S_{DD})$ for the pre-compensated sensor signal versus the supply signal $S_{DD}$ is established based on the N sensor signal values $S_N$ established, with a constant portion, a linear portion and a non-linear portion, wherein the non-linear portion of the fitting function is based on a residual offset portion R in the pre-compensated sensor signal S.

For the following explanations, it is exemplarily assumed that the fitting function reproduces the sensor output signal in the form of the (exemplarily rendered) Hall voltage of the Hall sensor.

Figure 6:
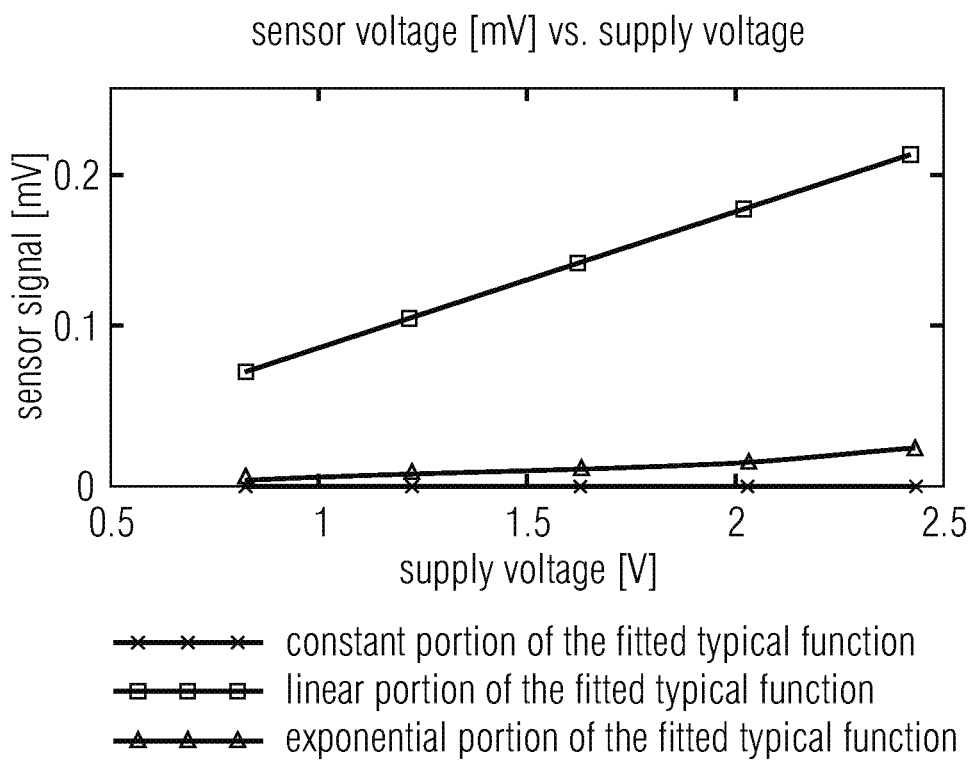
FIG. 6 a graphical illustration of the components in the form of a constant portion, a linear portion and a non-linear portion of the fitting function of FIG. 5 in accordance with an embodiment.

FIG. 6 shows a graphical illustration of the three components of the fitting function for the sensor signal (Hall voltage) versus the supply voltage, wherein the (red) curve provided with red crosses represents the constant portion "a" of the fitted typical function (fitting function), the (blue) curve provided with boxes represents the linear portion "dx" (useful signal portion) of the fitted function, and the (green) curve provided with triangles represents the exponential portion "$e^{dx}$" or "$dx'''$" of the fitted typical function. In the example illustrated, the constant portion "a" is approximately zero, since the sensor output signal in the present case exemplarily is a sensor output signal pre-compensated (by means of a spinning current). The linear portion "bx" is proportional to the external magnetic field applied, i.e. the external magnetic field can be calculated or established using the known sensitivity of the Hall sensor from the linear portion of the sensor output signal. The exponential portion "$e^{dx}$" or "$dx'''$" of the fitting function represents the offset portion in the sensor output signal. When observing the linear portion "bx" of the fitting function (which reproduces the Hall voltage), the (nearly) offset-free output signal of the Hall sensor is obtained.

Figure 7:
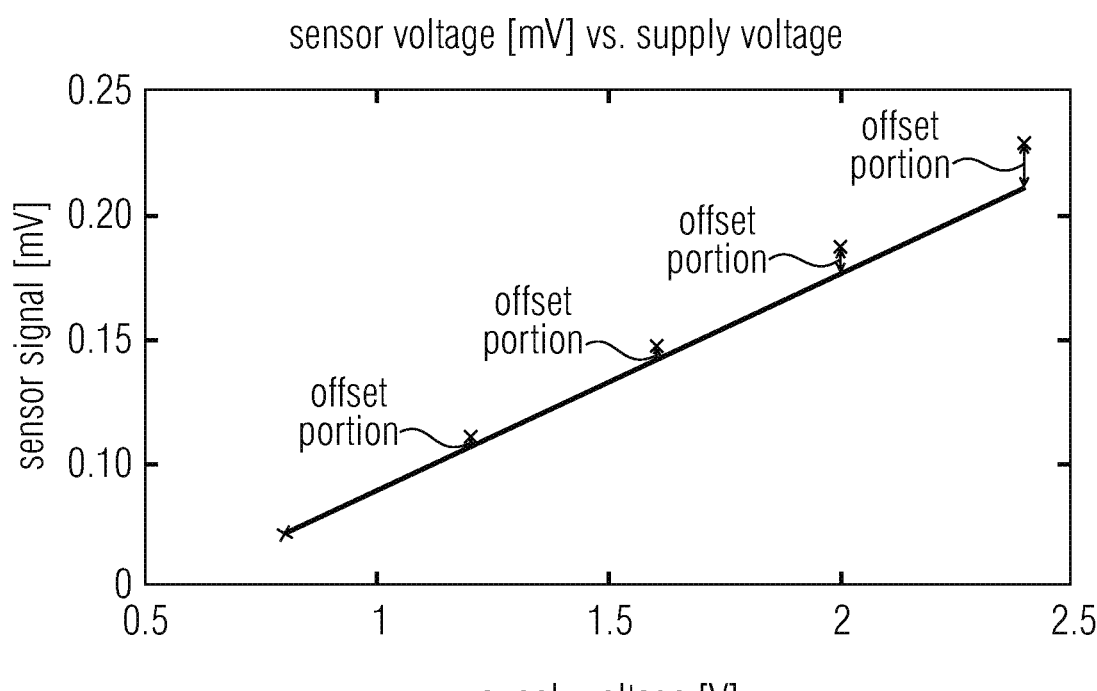
FIG. 7 a graphical illustration of measuring values of an external magnetic field and of the linear portion of the typical fitting function versus the supply signal in accordance with an embodiment.

FIG. 7 shows a graphical illustration of the sensor output signal (of the Hall voltage) versus the supply voltage, wherein the (red) crosses show the measuring values (in mV) with the constant external magnetic field (like 7.66 mT), wherein the continuous (blue) line shows the linear portion "bx" of the fitted typical function (fitting function). It can be seen from the graphical illustration of FIG. 7 that the offset portion is the difference between the measuring values for the external magnetic field and the linear portion of the fitting function, wherein the offset portion can be reduced using the present compensation method.

The value for the constant external magnetic field applied is obtained based on the quotient between measuring value (measured or established sensor voltage) and the sensitivity of the Hall sensor. In other words, when dividing the sensor voltage obtained by the sensitivity of the Hall sensor, the result is the external magnetic field constant over the supply voltage. The sensitivity of a Hall sensor may exemplarily be obtained during operation of the Hall sensor by means of coils for generating a predetermined magnetic field in the Hall sensor, or by means of a serial test and correspondingly storing typical values in a memory associated to the Hall sensor.

Figure 8:
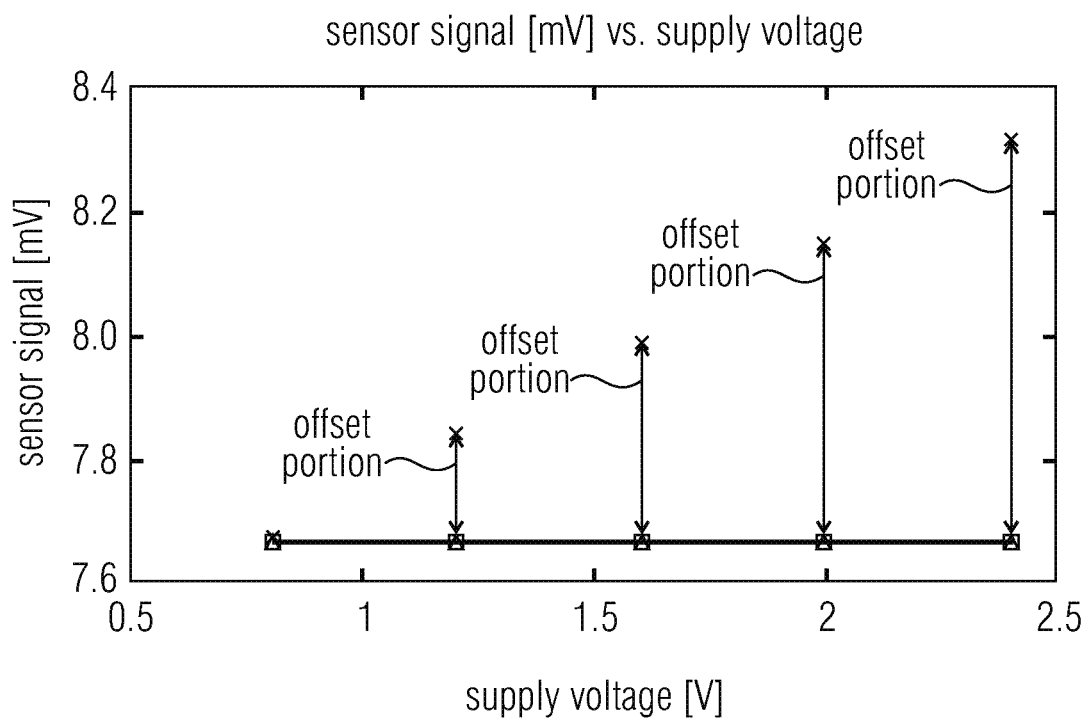
FIG. 8 a graphical illustration of the measuring values of the sensor output signal with a constant external magnetic field, of the linear portion of the typical fitting function and of the constant external magnetic field calculated using the sensitivity of the Hall sensor, versus the supply signal in accordance with an embodiment.

The graphical illustration in FIG. 8 shows the directly measured signal as measuring values (crosses), the linear portion of the fitted function (squares) and the external magnetic field applied (triangles) for comparative purposes. The measuring values (in mT) and the linear portion of the fitted function (in mT) in FIG. 8 have been calculated using the sensitivity of the Hall sensor from the measuring values (in mV), and from the linear portion of the fitted function (in mV) of FIG. 7.

It becomes obvious from the graphical illustration of FIG. 8 that the (actual) offset portion in the sensor signal is the difference between the measuring values (crosses) for the external magnetic field and the external magnetic field (triangles) (difference between measuring values–external field=Offset).

It also becomes obvious from the graphical illustration of FIG. 8 that the "compensatable" offset portion in the sensor signal is the difference between measuring values for the external magnetic field and the linear portion of the fitting function (difference between measuring values–linearly portion=compensatable portion). This offset portion can be compensated or at least reduced using the present compensation method.

Additionally, the difference between the linear portion of the fitting function and the external magnetic field applying provides the remaining offset (residual offset) remaining after executing the present compensation method (difference between linear portion–external field=remaining (residual) offset after the compensation method).

As can be gathered from the graphical illustration in FIG. 8, using the present concept, it is possible to separate the useful signal portion (linear portion of the fitting function) from the offset portion of the sensor output signal. Using the then known (approximately) offset-free measuring value (sensor signal value), the offset portion at a high supply voltage can be determined. Thus, the sensor output signal (the sensor output signal value) is measured/established again at a high supply voltage (a high supply voltage value). Assuming that the external magnetic field applying has remained constant (within a tolerance range) during this time for the two measuring processes, the offset portion at the high supply voltage can be determined in this way. The further measuring values (sensor output signal values) at the high supply voltage may then be corrected by the offset portion (established). Using the present concept, it is also possible to combine the high sensitivity of a Hall sensor at the high supply voltage thereof with the low offset portion at a low supply voltage.

The assumption or boundary condition that the offset portion has remained constant within the tolerance range during the two measurements (the offset measurements, see above) can, for example, be checked on by at first performing a measurement of the sensor output signal at a high supply voltage, subsequently determining the offset portion at a low supply voltage and then again measuring the same at a high supply voltage. Thus, the offset portion at the high supply voltage should basically have remained constant when the external magnetic field applying has remained constant (within the tolerance range).

As the previous embodiments have shown, the inventive concept of determining a fitting function of the sensor signal may exemplarily be related to the Hall voltage measured. Due to the proportional relationship between supply voltage and sensitivity, the linear portion of the fitted function represents (at least approximately) the useful signal portion in the sensor output signal. The method shown or the present concept, however, may also be applied when the sensor voltage (Hall voltage) has already been processed to a different quantity, like converted to the magnetic field applying to be determined (the magnetic field intensity to be determined). For this case, another typical function (fitting function) may also be used, wherein, when the fitting function represents the magnetic field derived from the sensor output signal, the constant portion of the fitting function can be used as the measuring signal (the useful signal portion), since the signal, i.e. the useful signal portion, is constant versus the supply voltage relative to the magnetic field to be detected (i.e. in the mT range).

The inventive concept may, of course, also be applied when the sensor output signal (like the Hall voltage) has been converted to a different quantity, wherein this is to be considered correspondingly for the fitting function and the parameters resulting from it.

Considering the above explanations relating to FIGS. 3 to 8, the flow chart, illustrated in FIG. 1, of the present concept or the method 100 for offset compensation of a sensor signal $S_0$ of a Hall element will be discussed below in greater detail.

Subsequently, a Hall sensor is referred to, wherein a Hall sensor may comprise one or several Hall effect sensor elements, wherein the Hall sensor provides the sensor signal or sensor output signal $S_0$ which may be present in the form of Hall voltage tapped or a quantity derived therefrom (as a rendered Hall voltage).

In step 110, a first offset compensation (pre-compensation) of the sensor signal $S_0$ is performed at first in order to provide a pre-compensated sensor signal S, wherein, in the (optional) first offset compensation, a, relative to a supply signal $S_{DD}$ (for the Hall sensor), linear portion of the offset in the sensor signal S is eliminated or at least reduced. For the first offset compensation (pre-compensation) of the sensor principle, the offset reduction principles mentioned above, like the spinning-current principle, the principle of orthogonal pair formation and/or the forced symmetry principle, or any combinations thereof or comparable compensation principle may be employed.

In further step 120, a plurality of N, with N≥3, sensor signal values $S_0$ is established within a time interval $\Delta t1$ with different offset measuring processes and different supply signal values $S_{DDN}$ of the supply signal $S_{DD}$, wherein the offset measuring processes are executed to be (shortly) successive in time such that, during the time interval $\Delta t1$, the measuring magnetic field acting on the Hall sensor is constant within a tolerance range.

The plurality of N, with N≥3, 5 or 10, sensor signal values $S_N$ is used in order to be able to subsequently reproduce the signal course of the output signal S versus to the supply signal values $S_{DDN}$ in a sufficiently precise manner. The plurality of N, with N≥3, 5 or 10, sensor signal values $S_N$ is, for example, established within an offset measuring time interval $\Delta t1$, wherein the measuring interval may comprise a value in a range between 1 s and 0.1 μs (1/f), depending on the Hall sensor types used and the digital and/or analog circuit arrangement connected to the Hall sensor and the processing or operating frequency (f) thereof, for example, 1 Hz to 10 MHz.

In step 130, a "fitting function" $F(S_{DD})$ for the pre-compensated sensor signal S versus the supply signal $S_D$ is determined based on the N sensor signal values $S_N$ established. Thus, the fitting function $F(S_{DD})$ exemplarily is as follows:

$F(S_{DD})$=constant portion+linear portion+non-linear portion $f(x)=a+bx+e^{dx}$, or $f(x)=a+bx+dx^n$ . . . (Taylor series), with $x=S_{DD}$, wherein the non-linear portion of the fitting function $F(S_{DD})$ is based on a residual offset portion R in the pre-compensated sensor signal S.

Depending on whether the pre-compensated sensor signal S exemplarily reproduces the Hall voltage established of the Hall sensor or (alternatively) a quantity derived from this, like the quantity of the external magnetic field calculated using the sensitivity of the Hall sensor, the following distinction of cases is done.

If the sensor signal S or the fitting function obtained from this reproduces the Hall voltage of the Hall sensor or if the pre-compensated sensor signal is proportional to a Hall voltage detected of the Hall sensor, the linear portion of the fitting function is based on the (constantly applying) external measuring magnetic field.

If the pre-compensated sensor signal is proportional to the measuring magnetic field acting, i.e. if the value of the measuring magnetic field versus the sensitivity of the Hall sensor has been calculated already from the Hall voltage detected, the constant portion of the fitting function is based on the (constantly applying) measuring magnetic field.

In step 140, the (nearly offset-free or, at least, offset-reduced) sensor signal value S1 is calculated or established, as an offset correction value, for example, based on the portion of the fitting function established, which is based on the (constantly applying) measuring magnetic field, i.e. in correspondence with the two alternatives indicated before, wherein the first alternative uses the linear portion and the second alternative uses the constant portion of the fitting function.

In step 150, a sensor signal value $S_N$ at a supply signal value $S_{DDN}$ is detected during operation of the Hall sensor, for example. In step 160, only the residual offset portion R of the pre-compensated sensor signal S at the supply signal value $S_{DDN}$ is established or calculated as the difference between the sensor signal value $S_N$ and the offset-reduced sensor signal value $S_0$ calculated. The residual offset portion R established of the pre-compensated sensor signal S, at this supply signal value $S_{DDN}$, can then be used as the offset correction value for the further offset compensation of the offset portion in the sensor output signal S.

The embodiments of the inventive concept for offset compensation may be applied to implementations where the Hall sensor comprises a Hall effect sensor element or a plurality of Hall effect sensor elements (exemplarily arranged in pairs). When the Hall sensor comprises at least a first Hall sensor for providing a first Hall sensor signal and a second Hall sensor element for providing a second Hall sensor signal, the sensor signal or sensor output signal of the Hall sensor may be based on a combination of the first and second Hall sensor signals. Alternatively, the sensor signal may be based on a combination of a first rendered sensor signal and a second rendered sensor signal which are derived from the first Hall sensor signal and the second Hall sensor signal, respectively.

Alternatively, it is also possible that, in case the Hall sensor comprises a plurality of Hall sensors, the method presented here for offset compensation can be applied to the individual Hall sensor signals of the Hall sensors or the correspondingly rendered Hall sensor signals. The method for offset compensation presented may thus be applied independently and separately to all Hall sensor signals obtained.

A plurality of Hall sensors may exemplarily be employed when the Hall sensor comprising the at least first and second Hall sensors, is implemented as an angle sensor or position sensor.

In accordance with a further optional step of the present invention, a current temperature $T_0$ at the Hall sensor can be detected, wherein the steps of establishing 160 the residual offset portion R and performing 170 the offset compensation are repeated when a change of the current temperature $T_0$ relative to a (directly) preceding offset compensation of at least 1° C., 2° C. or 5° C. is detected. Since the offset portion in the sensor output signal is temperature-dependent, optionally the residual offset portion R can be established whenever a "significant" change of the environmental or semiconductor temperature of the semiconductor substrate is detected by the Hall elements, in order to be able to take into consideration a change in the offset portion due to the present change in temperature, with subsequent offset compensation processes. In other words, this means that the residual offset portion R determined can be used until a significant change in temperature of, for example, at least 1° C., 2° C. or 5° C. has been established.

In accordance with embodiments, the first offset compensation (pre-compensation) in accordance with step 110 may, for example, be performed by means of a spinning-current method in order to obtain the pre-compensated sensor signal. Alternatively or in addition to the spinning-current method for pre-compensation, additionally a method for orthogonal pair formation and/or a forced symmetry method may be applied or performed in the first offset compensation.

Based on the residual offset portion R obtained or established, in a further optional step, a functional test of the Hall sensor and of a downstream sensor signal evaluating circuit can be performed during operation by means of a plausibility check of the residual offset portion R established in the (pre-compensated) sensor signal S of the Hall sensor. Since the offset portions of the Hall sensors during operation are known, this is how errors in the system can be recognized, like in an evaluating circuit downstream of the Hall sensor.

This is possible since a sensor offset drift and an amplifier offset drift can be differentiated between. During operation of the Hall sensor, the steps of establishing 160 the residual offset portion R and performing 170 the offset compensation can be performed in predetermined time intervals (spaced apart in time) or continuously during operation of the Hall sensor.

In accordance with embodiments of the present concept, the supply signal $S_{DD}$ for providing the supply signal values $S_{DD1}$, $S_{DD2}$ or $S_{DDN}$ may be fed to the Hall sensor as a supply voltage or a supply current.

Considering the above explanations relating to FIGS. 3 to 8, the flow chart, illustrated in FIG. 2, of the present concept or method for offset compensation of a sensor signal $S_O$ of a Hall element by means of modulation of variation of the supply signal will be discussed below in greater detail. In order to inhibit the calculating power of a sensor arrangement for performing the inventive concept or inventive method, for example, i.e. in order to keep the requirements to the sensor system relative to the calculating power used as low as possible, the following simplified considerations or assumptions can be made relating to the compensation method illustrated in FIG. 2, without exceedingly affect the effectivity and precision of the resulting offset compensation.

The method 200 for offset compensation of a sensor signal S or a sensor output signal of a Hall sensor or a quantity derived from it comprises the following steps.

In step 210, a first sensor signal value S1 of the sensor signal S is established in a first offset measuring process based on a first supply signal value $S_{DD1}$ of the supply signal $S_{DD}$, as is a second sensor signal value S2 of the sensor signal in a second offset measuring process based on a second supply signal value $S_{DD2}$ of the supply signal $S_{DD}$. The first supply signal value $S_{DD1}$ is selected such that a residual offset portion R1 in the first sensor signal value S1 is less than 50% of the first sensor signal value S1, wherein the first and the second offset measuring processes are executed successively in time such that, in the first and second offset measuring processes, the measuring magnetic field acting on the Hall sensor is constant within a tolerance range.

In step 220, an offset portion R2 in the sensor signal S for the second supply signal value $S_{DD2}$ is established as a difference between the second sensor signal value $S_{DD2}$ and the first sensor signal value $S_{DD1}$, wherein, in step 230, an offset compensation of the sensor signal S is performed based on the offset portion R established at the second supply signal value $S_{DD2}$.

In step 220 of establishing the first sensor signal value S1, the first supply signal value $S_{DD1}$ is selected to be smaller than the second supply signal value $S_{DD2}$ by a factor of at least 2, 3 or 5. The low (first) supply signal value is selected to be smaller than or equaling (≤) 50%, 30%, 20% or 10% when compared to the higher (second) supply signal value.

In accordance with another optional step of the present method, a current temperature $T_0$ at the Hall sensor can also be detected, wherein the steps of establishing the residual offset portion R1 and of performing a second offset compensation are repeated when a change in the current temperature $T_0$ of at least 1° C., 2° C. or 5° C. when compared to a (for example directly) preceding second offset compensation is detected. Since the offset portion present in the sensor output signal is temperature-dependent, optionally establishing the residual offset portion R1 can be performed whenever a "significant" change of the environmental or semiconductor temperature of the semiconductor substrate is detected using the Hall elements, in order to be able to take into consideration a change in the offset portion due to the temperature change present for subsequent offset compensation processes. In other words, this means that the residual offset portion R determined can be used until a significant change in temperature of, for example, at least 1° C., 2° C. or 5° C. has been found.

In step 210, the first sensor signal value S1 is provided in the first offset measuring process and the second sensor signal value S2 is provided in the second offset measuring process, within an offset measuring time interval $\Delta t1$, wherein a test sensor signal value TS1 at the first supply signal value $S_{DD1}$ is detected within the measuring time interval $\Delta t1$ after the first and the second offset measuring process, and wherein a match (within a tolerance range) of the first sensor signal value S1 and of the test sensor signal value TS1 indicates the presence of a constant temperature and/or a constant measuring magnetic field acting during the measuring time interval $\Delta t1$.

The sensor signal values S1, S2 are established in different offset measuring processes and using different supply signal values $S_{DDN}$ of the supply signal $S_{DD}$ within a time interval $\Delta t1$, wherein the offset measuring processes are executed at (shortly) successive times so that, during the time interval $\Delta t1$, the measuring magnetic field acting on the Hall sensor is constant within a tolerance range. The measuring interval is exemplarily dependent on the Hall sensor types used and the digital and/or analog circuit arrangement connected to the Hall sensor and the processing or operating frequency (f) thereof of, for example 1 Hz to 10 MHz and may comprise a value in a range between 1 s and 0.1 µs (1/f).

Additionally, the method 200 may comprise a step of performing an offset pre-compensation of the sensor signal S before the step of establishing the first and second sensor signal values S1, S2, wherein the offset pre-compensation is performed by means of a spinning-current method or by means of a method of orthogonal pair formation and/or by means of a forced symmetry method in order to obtain a pre-compensated sensor signal S.

Based on the residual offset portion R obtained or established, in a further optional step, a functional test of the Hall sensor and of a downstream sensor signal evaluating circuit may be performed during operation by means of a plausibility check of the residual offset portion R established in the (pre-compensated) sensor signal S of the Hall sensor. Since the offset portions of the Hall sensors during operation are known, errors in the system, like in an evaluating circuit downstream of the Hall sensor, can be recognized by this. This is possible, since a sensor offset drift and an amplifier offset drift can be differentiated between. During operation of the Hall sensor, the steps of establishing 160 the residual offset portion R and of performing 170 the offset compensation can be performed in predetermined time intervals (spaced apart in time) or continuously during operation of the Hall sensor.

In accordance with a further embodiment, the steps of establishing the residual offset portion R1 and of performing the second offset compensation may additionally be performed in predetermined time intervals spaced apart in time during operation of the Hall sensor. Alternatively, the steps of establishing the residual offset portion and of performing the second offset compensation may be performed continuously during operation of the Hall sensor. In addition, the supply signal $S_{DD}$ for providing supply signal values $S_{DD1}$, $S_{DD2}$ may be fed to the Hall sensor as a supply voltage or a supply current.

In accordance with a further embodiment, the Hall sensor may comprise at least a first Hall sensor element for providing a first Hall sensor signal and a second Hall sensor element for providing a second Hall sensor signal, wherein the sensor signal is based on a combination of the first and second Hall sensor signals, or wherein the sensor signal may be based on a combination of a first rendered sensor signal and a second rendered sensor signal which are derived from the first and second Hall sensor signals. The first Hall sensor element and the second Hall sensor element may, for example, form an angle sensor or position sensor.

When considering a potential typical function F(x): a+bx+$e^{dx}$ (which has been used in the above example), the term $e^{dx}$ will approach zero for small supply voltages. The constant portion of the typical function usually is very small anyway since the linear portion of the offset has already been compensated by the SC principle. This means that it is possible to measure the external magnetic field at a considerably reduced offset using a single measurement at low a supply voltage. Only the constant portion and the exponential portion will remain as the residual offset, but are negligibly small.

In a practical application, this means that the external magnetic field is measured at low a supply voltage. The result is a measuring value of a very low offset which can be assumed to be zero. Subsequently, the supply voltage is increased and measured again. At that point, the measuring signal contains the actual magnetic field and the relatively large offset. Assuming that the external magnetic field has remained constant during this time, the offset can be determined at high a supply voltage in this way. The further measuring values at high a supply voltage can then be corrected by the offset. This means that the high sensitivity at high a supply voltage can be combined with the low offset at small a supply voltage.

Using the known, approximately offset-free measuring value (sensor output signal value) at low a supply signal value, the offset portion in the sensor output signal can be determined at a high supply signal voltage. Here, the sensor output signal is determined or measured again at a high supply signal value, wherein the assumption has to be kept to that the external magnetic field (externally applying measuring magnetic field) has remained constant within a tolerance range during that time, or is negligibly small, so that the offset portion in the sensor output signal can be determined at this very high supply signal value. The further measuring values, i.e. the sensor output signal values, at the high supply signal value may then be corrected by the offset portion established.

The assumption that the offset has remained constant during the measurements may, for example, be checked by at first performing a measurement at a high supply voltage, subsequently determining the offset at a low supply voltage and, after that, at a high offset voltage.

The methods 100, 200 described before may also be applied when the Hall sensor is fed by a supply current as the supply signal. Supply voltage and supply current may be transferred into each other using the resistance of the Hall sensor.

The present concept for offset compensation exemplarily is characterized by the fact that the offset of a Hall sensor can be determined approximately during operation. A more complicated serial test with, partly, different temperatures for offset compensation can consequently be avoided.

The concept may also be employed particularly effectively when, due to a spinning-current operation of a Hall sensor, constant and linear offset portions in the Hall voltage can be removed nearly completely. When plotting the Hall voltage measured versus the supply voltage of a Hall element, linear portions can consequently be caused only by the magnetic signal. All the other portions (constant, square and higher order) can then be separated from the signal and are consequently interpreted as being offset. This allows an offset correction using calculating means.

By means of a modulation of the supply voltage of a Hall element (Hall sensors), the offset portion of it in the sensor output signal can also be determined using an external magnetic field, in case the external magnetic field is constant within a tolerance range while determining the offset portion.

Since the present compensation method 100, 200 still provides sufficiently good compensation results when the external magnetic field (i.e. the magnetic field intensity or flux density) remains within a predetermined range or there is no or only a negligibly small external magnetic field, a so-called "tolerance range" for the "respective stability" of the external magnetic field is introduced or provided. This means that the tolerance range indicates that region within which the external magnetic field is allowed to change while determining the offset portion or residual offset portion. The tolerance range may, for example, indicate that the external magnetic field changes by less than 50%, 30%, 20%, 10%, 5%, 1% or 0.1% while determining the offset portion or residual offset portion or that there is no or only a negligibly small external magnetic field. The lower the tolerance range which can be assumed and kept, the more precisely can the offset compensation be performed. In case a potential or typical change rate of the external magnetic field is known, a time interval $\Delta t1$ for the compensation process can be selected such that the offset measuring processes are executed at (short) successive times such that, during the time interval $\Delta t1$, the measuring magnetic field acting on the Hall sensor is constant within the (predetermined) tolerance range or there is no or only a negligibly small external magnetic field.

Embodiments of the present compensation method 100, 200 may consequently be performed with changes in temperature. This approach is very effective since, with a constant temperature, the offset usually remains the same and consequently does not have to be determined continuously.

Embodiments of the present compensation method 100, 200 may also be executed in further, different scenarios.

Thus, the compensation method 100, 200 may exemplarily be performed once in a serial test, wherein the serial test entails a measurement relative to the temperature. Thus, the compensation method 100, 200 may exemplarily be performed constantly during operation. Thus, the compensation method 100, 200 may, for example, be performed in certain intervals.

Figure 9:
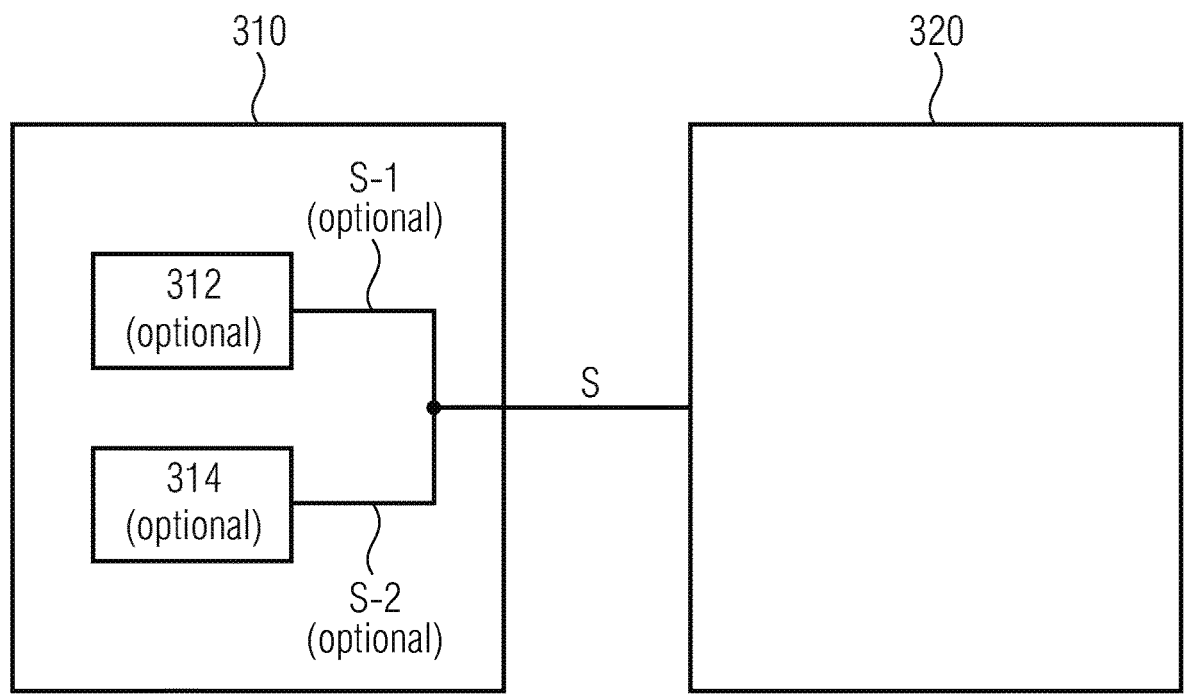
FIG. 9 an exemplary block diagram of a sensor arrangement comprising a Hall sensor and processing means in accordance with an embodiment.

FIG. 9 shows an exemplary block diagram of a sensor arrangement 300 with a Hall sensor 310 for detecting a component of a measuring magnetic field and for outputting a sensor signal S based on the detected component of the measuring magnetic field and processing means 320 configured to perform the method 100, 200, discussed above, for offset compensation of a Hall sensor.

In accordance with an embodiment, the Hall sensor 310 may comprise any Hall effect sensor element, like a horizontal or vertical Hall effect sensor element. The Hall sensor 310 may, for example, comprise a Hall effect sensor element or a plurality of (exemplarily interconnected) Hall effect sensor elements.

In accordance with an embodiment, the Hall sensor 310 may comprise at least a first Hall sensor element 312 for providing a first Hall sensor signal S-1 and a second Hall sensor element (314) for providing a second Hall sensor signal S-2. Thus, the sensor signal S may be based on a combination of the first and second Hall sensor signals (S-1, S-2). In addition, the sensor signal S may be based on a combination of a first rendered sensor signal and a second rendered sensor signal which are derived from the first and second Hall sensor signals.

In accordance with an embodiment, the Hall sensor 310 may comprise at least a first Hall sensor element 312 for providing a first Hall sensor signal S-1 and a second Hall sensor element 314 for providing a second Hall sensor signal S-2, wherein the method for offset compensation is performed using the first Hall sensor signal and the second Hall sensor signal.

In accordance with an embodiment, the first Hall sensor element 312 and the second Hall sensor element 314 may form an angle sensor or position sensor.

Although some aspects have been described in the context of a device, it is clear that these aspects also represent a description of the corresponding method, such that a block or element of a device also corresponds to a respective method step or a feature of a method step. Analogously, aspects described in the context of or as a method step also represent a description of a corresponding block or item or feature of a corresponding device. Some or all of the method steps may be executed by (or using) a hardware apparatus, like, for example, the processing means 320, a microprocessor, a programmable computer or an electronic circuit. In some embodiments, some or several of the most important method steps may be executed by such an apparatus.

Depending on certain implementation requirements, embodiments of the invention may be implemented in hardware or in software, or at least partly in hardware or at least partly in software. The implementation can be performed using a digital storage medium, for example a floppy disk, a DVD, BluRay disc, CD, ROM, PROM, EPROM, EEPROM or a FLASH memory, a hard drive or another magnetic or optical memory having electronically readable control signals stored thereon, which cooperate or are capable of cooperating with a programmable computer system such that the respective method is performed. Therefore, the digital storage medium may be computer-readable.

Some embodiments according to the invention include a data carrier comprising electronically readable control signals, which are capable of cooperating with a programmable computer system such that one of the methods described herein is performed.

Generally, embodiments of the present invention can be implemented as a computer program product with a program code, the program code being operative for performing one of the methods when the computer program product runs on a computer.

The program code may, for example, be stored on a machine-readable carrier. Other embodiments comprise the computer program for performing one of the methods described herein, wherein the computer program is stored on a machine readable carrier.

In other words, an embodiment of the inventive method is, therefore, a computer program comprising a program code for performing one of the methods described herein, when the computer program runs on a computer.

A further embodiment of the inventive methods is, therefore, a data carrier (or a digital storage medium or a computer-readable medium) comprising, recorded thereon, the computer program for performing one of the methods described herein. The data carrier or the digital storage medium or the computer-readable medium typical is tangible and/or non-volatile.

A further embodiment of the inventive method is, therefore, a data stream or a sequence of signals representing the computer program for performing one of the methods described herein. The data stream or the sequence of signals may, for example, be configured to be transferred via a data communication connection, for example via the Internet.

A further embodiment comprises processing means, for example a computer, or a programmable logic device, configured to or adapted to perform one of the methods described herein.

A further embodiment comprises a computer having installed thereon the computer program for performing one of the methods described herein.

A further embodiment according to the invention comprises a device or a system configured to transfer a computer program for performing at least one of the methods described herein to a receiver. The transmission can be performed electronically or optically. The receiver may, for example, be a computer, a mobile device, a memory device or the like. The apparatus or system may, for example, comprise a file server for transferring the computer program to the receiver.

In some embodiments, a programmable logic device (for example a field-programmable gate array, FPGA) may be used to perform some or all of the functionalities of the methods described herein. In some embodiments, a field-programmable gate array may cooperate with a microprocessor in order to perform one of the methods described herein. Generally, in some embodiments, the methods are performed by any hardware apparatus. This can be universally applicable hardware, such as a computer processor (CPU), or hardware specific for the method, like an ASIC.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for offset compensation of a sensor signal $S_0$ of a Hall sensor, comprising:
  A performing a first offset compensation of the sensor signal $S_0$ for providing a pre-compensated sensor signal S, wherein a portion of the offset, linear relative to a supply signal $S_{DD}$, in the sensor signal is at least reduced in the first offset compensation,
  B establishing a plurality of N, with N≥3, sensor signal values $S_N$ in different offset measuring processes and with different supply signal values $S_{DDN}$ within a time interval Δt1, wherein the offset measuring processes are executed in a temporal succession such that the measuring magnetic field acting on the Hall sensor is constant within a tolerance range during the time interval Δt1,
  C determining a fitting function $F(S_{DD})$ for the pre-compensated sensor signal versus the supply signal $S_{DD}$ based on the established N sensor signal values $S_N$, with
  C1 $F(S_{DD})$=constant portion+linear portion+non-linear portion
  C2 wherein the non-linear portion of the fitting function is based on a residual offset portion R in the pre-compensated sensor signal S, and
  C3 wherein the linear portion of the fitting function is based on the measuring magnetic field when the pre-compensated sensor signal is proportional to a detected Hall voltage of the Hall sensors; and
  C4 wherein the constant portion of the fitting function is based on the measuring magnetic field when the pre-compensated sensor signal is proportional to the measuring magnetic field acting which is established based on the detected Hall voltage and the sensitivity of the Hall sensor;
  D calculating an offset-reduced sensor signal value $S_0$ based on the portion of the established fitting function which is based on the measuring magnetic field;
  E detecting a sensor signal value $S_N$ at a supply signal value $S_{DDN}$;
  F establishing the residual offset portion R of the pre-compensated sensor signal S at the supply signal value $S_{DDN}$ as the difference between the sensor signal value $S_N$ and the offset-reduced sensor signal value $S_0$; and
  G performing an offset compensation of the sensor signal S based on the established offset portion R at the supply signal value $S_{DDN}$.

2. The method in accordance with claim 1, further comprising:
  detecting a current temperature $T_0$ at the Hall sensor, wherein establishing the residual offset portion and performing the second offset compensation are repeated when detecting a change in the current temperature $T_0$ of at least 2° C. relative to a previously performed offset compensation.

3. The method in accordance with claim 1, wherein the first offset compensation is performed by means of a spinning-current method in order to acquire the pre-compensated sensor signal.

4. The method in accordance with claim 3, further comprising:
  performing a method of orthogonal pair formation and/or a forced symmetry method in the first offset compensation.

5. The method in accordance with claim 1, further comprising:
  performing a functional test of the Hall sensor and a downstream sensor signal evaluating circuit during operation by means of a plausibility check of the established residual offset portion R in the pre-compensated sensor signal S of the Hall sensor.

6. The method in accordance with claim 1, wherein establishing the residual offset portion R and performing the offset compensation are performed in predetermined time intervals spaced apart in time during operation of the Hall sensor.

7. The method in accordance with claim 1, wherein establishing the residual offset portion and performing the second offset compensation are performed continuously during operation of the Hall sensor.

8. The method in accordance with claim 1, wherein a supply signal $S_{DD}$ for providing the supply signal values $S_{DD1}$, $S_{DD2}$ is fed to the Hall sensor as a supply voltage or a supply current.

9. The method in accordance with claim 1, wherein the Hall sensor comprises at least a first Hall sensor element for providing a first Hall sensor signal and a second Hall sensor element for providing a second Hall sensor signal,
wherein the sensor signal is based on a combination of the first and second Hall sensor signals,
or
wherein the sensor signal is based on a combination of a first rendered sensor signal and a second rendered sensor signal derived from the first and second Hall sensor signals.

10. The method in accordance with claim 9, wherein the first Hall sensor element and the second Hall sensor element form an angle sensor or a position sensor.

11. A sensor arrangement comprising:
a Hall sensor for detecting a component of a measuring magnetic field and for outputting a sensor signal S based on the detected component of the measuring magnetic field, and
a processor configured to execute the method for offset compensation of a Hall sensor in accordance with claim 1.

12. The sensor arrangement in accordance with claim 11, wherein the Hall sensor comprises a horizontal or a vertical Hall effect sensor element.

13. The sensor arrangement in accordance with claim 11, wherein the Hall sensor comprises at least a first Hall sensor element for providing a first Hall sensor signal and a second Hall sensor element for providing a second Hall sensor signal,
wherein the sensor signal S is based on a combination of the first and second Hall sensor signals,
or
wherein the sensor signal is based on a combination of a first rendered sensor signal and a second rendered sensor signal derived from the first and second Hall sensor signals.

14. The sensor arrangement in accordance with claim 13, wherein the first Hall sensor element and the second Hall sensor element form an angle sensor or position sensor.

15. The sensor arrangement in accordance with claim 11, wherein the Hall sensor comprises at least a first Hall sensor element for providing a first Hall sensor signal and a second Hall sensor element for providing a second Hall sensor signal,
wherein the method for offset compensation is performed using the first Hall sensor signal and using the second Hall sensor signal.

16. A method for offset compensation of a sensor signal S of a Hall sensor, comprising:
A establishing a first sensor signal value S1 of the sensor signal S in a first offset measuring process based on a first supply signal value $S_{DD1}$, and a second sensor signal value S2 of the sensor signal in a second offset measuring process based on a second supply signal value $S_{DD2}$, wherein the second supply signal value $S_{DD2}$ is different to the first supply signal value $S_{DD1}$;
A1 wherein the first supply signal value $S_{DD1}$, is selected such that a residual offset portion R1 in the first sensor signal value S1 is less than 50% of the first sensor signal value S1, and
A2 wherein the first and second offset measuring processes are executed in a temporal succession such that the measuring magnetic field acting on the Hall sensor is constant within a tolerance range in the first and second offset measuring processes;
B establishing an offset portion R2 in the sensor signal S for the second supply signal value $S_{DD2}$ as the difference between the second sensor signal value $S_{DD2}$ and the first sensor signal value $S_{DD1}$; and
C performing an offset compensation of the sensor signal S based on the established offset portion R at the second supply signal value $S_{DD2}$.

17. The method in accordance with claim 16, wherein, in establishing the first sensor signal value S1, the first supply signal value $S_{DD1}$ is selected to be smaller by a factor of at least 2 than the second supply signal value $S_{DD2}$.

18. The method in accordance with claim 16, further comprising:
detecting a current temperature $T_0$ at the Hall sensor, wherein establishing the residual offset portion R1 and performing a second offset combination are repeated when detecting a change in the current temperature $T_0$ of at least 2° C. relative to a previously performed second offset compensation.

19. The method in accordance with claim 16, wherein the first sensor signal value S1 is provided in the first offset measuring process and the second sensor signal value S2 is provided in the second offset measuring process within an offset measuring time interval Δt1, further comprising:
providing a test sensor signal value TS1 at the first supply signal value $S_{DD1}$ within the measuring time interval Δt1 after the first and second offset measuring processes, wherein a match (within a tolerance range) of the first sensor signal value S1 and the test sensor signal value TS1 indicates the presence of a constant temperature and a constant measuring magnetic field acting during the measuring time interval Δt1.

20. The method in accordance with claim 16, further comprising:
performing an offset pre-compensation of the sensor signal S before establishing the first and second sensor signal values S1, S2,
wherein the offset pre-compensation is performed by means of a spinning-current method or by means of a method for orthogonal pair formation and/or by means of a forced symmetry method, in order to acquire a pre-compensated sensor signal S.

21. The method in accordance with claim 16, further comprising:
performing a functional test of the Hall sensor and a downstream sensor signal evaluating circuit during operation by means of a plausibility check of the established offset portion R in the sensor signal S of the Hall sensor.

22. The method in accordance with claim 16, wherein establishing the residual offset portion R1 and performing the second offset compensation are performed in predetermined time intervals spaced apart in time during operation of the Hall sensor.

23. The method in accordance with claim 16, wherein establishing the residual offset portion and performing the second offset compensation are performed continuously during operation of the Hall sensor.

24. The method in accordance with claim 16, wherein the supply signal $S_{DD}$ for providing supply signal values $S_{DD1}$, $S_{DD2}$ is fed to the Hall sensor as a supply voltage or a supply current.

25. The method in accordance with claim 16, wherein the Hall sensor comprises at least a first Hall sensor element for providing a first Hall sensor signal and a second Hall sensor element for providing a second Hall sensor signal,
wherein the sensor signal is based on a combination of the first and second Hall sensor signals,
or wherein the sensor signal is based on a combination of a first rendered sensor signal and a second rendered sensor signal derived from the first and second Hall sensor signals.

26. The method in accordance with claim 25, wherein the first Hall sensor element and the second Hall sensor element form an angle sensor or position sensor.

27. A sensor arrangement comprising:
a Hall sensor for detecting a component of a measuring magnetic field and for outputting a sensor signal S based on the detected component of the measuring magnetic field, and
a processor configured to execute the method for offset compensation of a Hall sensor in accordance with claim 16.

28. The sensor arrangement in accordance with claim 27, wherein the Hall sensor comprises a horizontal or a vertical Hall effect sensor element.

29. The sensor arrangement in accordance with claim 27, wherein the Hall sensor comprises at least a first Hall sensor element for providing a first Hall sensor signal and a second Hall sensor element for providing a second Hall sensor signal,
wherein the sensor signal S is based on a combination of the first and second Hall sensor signals,
or
wherein the sensor signal is based on a combination of a first rendered sensor signal and a second rendered sensor signal derived from the first and second Hall sensor signals.

30. The sensor arrangement in accordance with claim 29, wherein the first Hall sensor element and the second Hall sensor element form an angle sensor or position sensor.

31. The sensor arrangement in accordance with claim 27, wherein the Hall sensor comprises at least a first Hall sensor element for providing a first Hall sensor signal and a second Hall sensor element for providing a second Hall sensor signal,
wherein the method for offset compensation is performed using the first Hall sensor signal and using the second Hall sensor signal.

* * * * *